United States Patent [19]

Sakai

[11] Patent Number: 5,255,219
[45] Date of Patent: Oct. 19, 1993

[54] ULTRAVIOLET-ERASABLE TYPE NONVOLATILE SEMICONDUCTOR MEMORY DEVICE HAVING ASYMMETRICAL FIELD OXIDE STRUCTURE

[75] Inventor: Katsuya Sakai, Kawasaki, Japan

[73] Assignee: Kabushiki Kaisha Toshiba, Kawasaki, Japan

[21] Appl. No.: 648,131

[22] Filed: Jan. 30, 1991

[30] Foreign Application Priority Data

Jan. 31, 1990 [JP] Japan .................. 2-21556

[51] Int. Cl.⁵ .................................. H01L 29/78
[52] U.S. Cl. ............................. 365/185; 257/315
[58] Field of Search ............. 365/185; 357/23.5, 23.6, 357/23.11

[56] References Cited

U.S. PATENT DOCUMENTS

| | | | |
|---|---|---|---|
| 4,317,272 | 3/1981 | Kuo et al. | 357/23.5 |
| 4,451,904 | 5/1984 | Sugiura et al. | 365/182 |
| 4,608,751 | 9/1986 | McElroy | 357/23.5 |
| 4,763,178 | 8/1988 | Sakui et al. | 357/23.6 |
| 4,766,473 | 8/1988 | Kuo | 365/185 |
| 4,829,351 | 5/1989 | Engles et al. | 357/23.5 |
| 5,005,060 | 4/1991 | Mazzali | 365/185 X |
| 5,065,218 | 11/1991 | Arimoto et al. | 357/23.6 |
| 5,084,745 | 1/1992 | Iizuka | 357/23.5 |
| 5,084,746 | 1/1992 | Arimoto et al. | 357/23.6 |

FOREIGN PATENT DOCUMENTS

| | | | |
|---|---|---|---|
| 0236676 | 9/1987 | European Pat. Off. | |
| 0387936 | 9/1990 | European Pat. Off. | 357/23.5 |
| 0098978 | 6/1983 | Japan | 357/23.5 |
| 0225862 | 10/1986 | Japan | 357/23.5 |

OTHER PUBLICATIONS

Electronics, vol. 62, No. 3, p. 84, Mar. 1989, Hasbrouck Heights, NJ, US, B.C. Cole, "A Disadvantage Leads to a Fast 4-MBIT EPROM".

*Primary Examiner*—Eugene R. LaRoche
*Assistant Examiner*—Son Dinh
*Attorney, Agent, or Firm*—Finnegan, Henderson, Farabow, Garrett & Dunner

[57] ABSTRACT

For obtaining improved writing characteristics, a reduced source resistance and an increased cell current of a ultraviolet-erasable type nonvolatile semiconductor memory device, a plurality of field oxide films with an asymmetrical pattern are provided which are arranged in rows and columns to define memory cells with a stacked gate structure having floating and control gates. Each of the field oxide films has an extended portion at both sides in a row direction. The floating and control gates include a portion extending on each of the field oxide films in a column direction. A cell slit is located at the extended portion of the field oxide film to electrically insulate the floating gates for every rows from one another. A common control gate layer is provided for every rows as the control gates of memory cells.

5 Claims, 5 Drawing Sheets

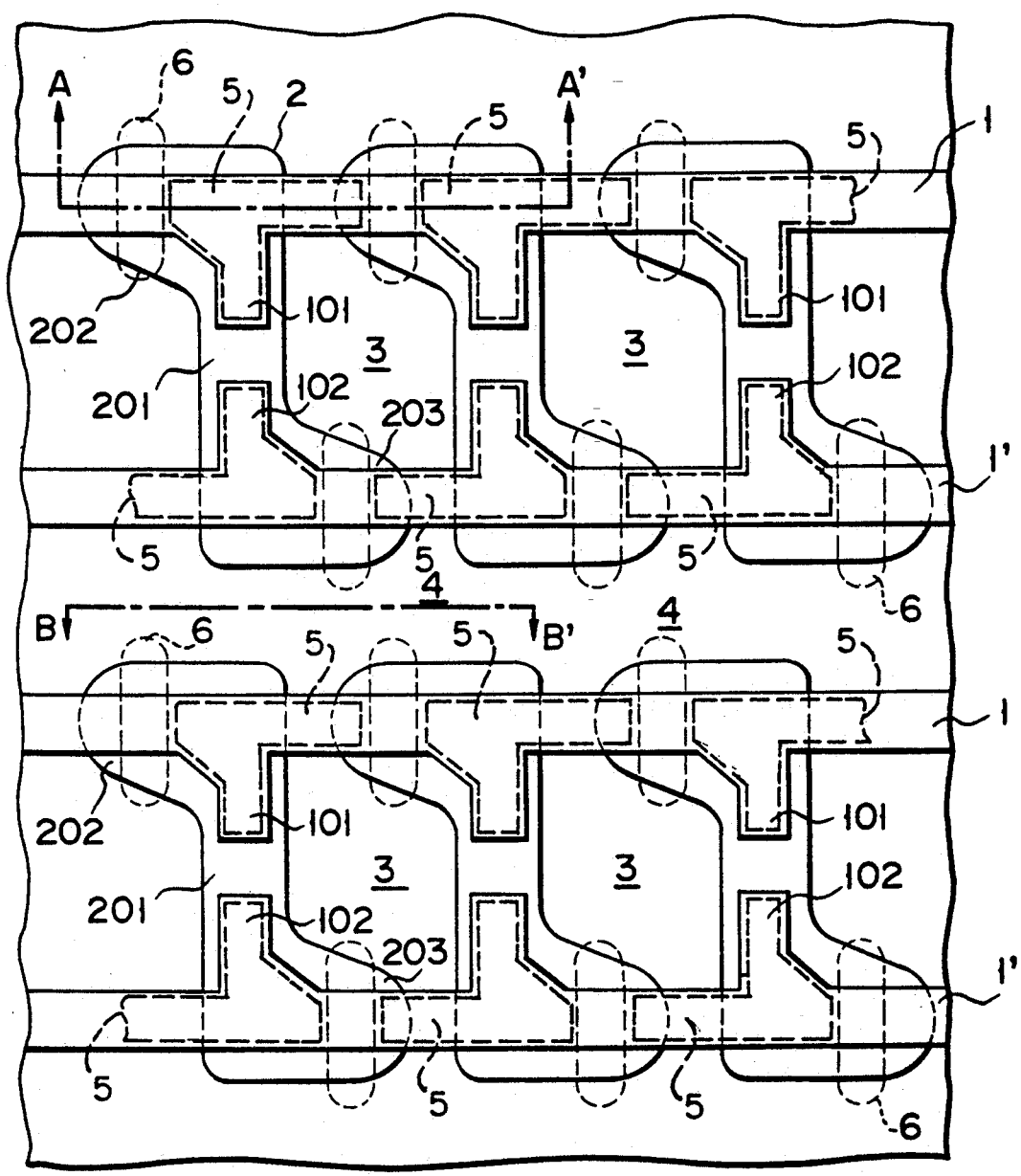
F I G. 1A

ULTRAVIOLET-ERASABLE TYPE NONVOLATILE SEMICONDUCTOR MEMORY DEVICE HAVING ASYMMETRICAL FIELD OXIDE STRUCTURE

BACKGROUND OF THE INVENTION

1. Field of the Invention

This invention relates to an ultraviolet-erasable type nonvolatile semiconductor memory device, and more particularly to one which has an asymmetrical field oxide structure.

2. Description of the Related Art

There has been provided an ultraviolet-erasable type nonvolatile semiconductor memory device (hereinafter called "EPROM") which includes memory cells each comprised of a MOS transistor having floating and control gates. In this device, an electric charge, for example, electrons, is selectively stored in the floating gates of the memory cells to perform programming of data, and ultraviolet light is applied thereto to erase the stored data.

FIGS. 2A through 2D show a conventional EPROM memory cell array. Specifically, FIG. 2A is a plan view of the array, FIG. 2B a sectional view taken along line A—A' in FIG. 2A, FIG. 2C a sectional view taken along line B—B' in FIG. 2A, and FIG. 2D a sectional view taken along line C—C' in FIG. 2A, respectively.

In the drawings, reference numeral 21 denotes control gates disposed on an upper portion of a stacked gate structure. These control gates 21 are arranged parallel to one another, and extend in a row direction on a semiconductor substrate surface. Reference numeral 22 denotes field oxide films for isolation, each having a dumbbell-shaped pattern having a semielliptical portion at both ends. The field oxide films 22 are arranged in row and column directions on the semiconductor substrate surface. Reference numeral 23 denotes drain regions, each of which is defined by two field oxide films 22 adjacent in the row direction and two control gates 21 crossing the semielliptical portions of the field oxide films 22 in the row direction. A source region 24 is provided by a region facing each drain region 23 through one control gate 21 in the column direction.

A region enclosed by a dotted line in FIG. 2A is a cell slit 26, which shows a boundary region between floating gates 25 provided at the lower portion of the stacked gate structure, that is, which includes no floating gate 25 disposed under the control gates 21 and crosses each source region 24 in the column direction as shown in FIG. 2B. In FIG. 2B, reference numeral 31 denotes a P-type silicon substrate, 32 a gate insulating film provided between the substrate 31 and the floating gate 25, 33 an insulating film formed between the floating gate 25 and the control gate 21, respectively.

As described above, memory cells are arranged in the row and column directions, thereby providing a memory cell array. Further, in each memory cell as shown in FIG. 2C, the floating gate 25 is formed on the gate insulating film 32 located between the drain and source regions 23 and 24, and the control gate 21 is provided above the floating gate 25 with an insulating film 33 between the control gate 21 and the floating gate 25.

In general, to increase the operating speed of the memory device, the current driving ability of each memory cell must be improved. Therefor, if a capacitance between the substrate 31 and the floating gate 25 is given by C1 and a capacitance between the floating gate 25 and the control gate 21 is given by C2 (referring to FIG. 2C), it is necessary to increase the equivalent capacitance rendered by C1·C2/(C1+C2). For increasing the equivalent capacitance, respective values of C1 and C2 may be high. Further, writing characteristics are improved as an electric field applied between the substrate 31 and the floating gate 25 is increased during data writing. Consequently, considering writing characteristics, it may be desirable that the capacitance C2 is higher than the capacitance C1.

For these reasons, the floating gate 25 is extended on the field oxide film 22 to increase the capacitance C2 between the floating gate 25 and the control gate 21 as shown in FIG. 2B. For a greater increase in the capacitance C2, it has been proposed to partially enlarge widths of the floating gate 25 and control gate 21 on the field oxide film 22 as shown in FIG. 3. However, in such a structure, since the cell slit 26 is provided on an approximately central portion of the field oxide film 22, the enlarged gate portion is removed by the cell slit 26 to leave only a part thereof. Accordingly, the structure fails to provide a remarkable advantage even if a part of the gate width is increased.

A method of the conventional memory cell structure will be explained with reference to FIGS. 2A–2C. At first, the dumbbell-shaped field oxide films 22 each having the semielliptical portion at both ends are formed in the P-type semiconductor substrate 31 in the row and column directions of the substrate surface, thereby isolating memory cells from one another. Then, conductive layers for providing the floating gates 25 are formed in the row direction of the substrate surface in such a manner that they extend onto both the gate insulating films 32 formed on the semiconductor substrate 31 and both ends of the semielliptical portions of the field oxide film 22. Thereafter, the conductive layers extending to both ends of the semielliptical portions in the row direction are selectively removed by a desired width so as to cross them. The cell slits 26 are then formed to provide the floating gates 25 of respective memory cells. At this time, the semiconductor substrate 31, which is exposed among the semielliptical portions of two field oxide films 22 that are adjacent to each other in the column direction, is selectively removed.

However, as described above, since the cell slits 26 are formed in the semiconductor substrate 31, unwanted thickness steps are provided in the source region 24. As shown in FIG. 2D, the source region 24 is formed by ion-implanting N-type impurity into the P-type semiconductor substrate 31, and diffusing the implanted impurity thereinto. Narrow portions may be provided by the thickness steps in the N+-type layer serving as the source region 24, thereby increasing the resistance between the source region and a source contact (not shown).

SUMMARY OF THE INVENTION

It is an object of this invention to provide an ultraviolet-erasable type nonvolatile semiconductor memory device having an improved field oxide structure.

It is another object of the invention to provide an ultraviolet-erasable type nonvolatile semiconductor memory device having improved cell slits.

According to one aspect of the present invention, there is provided an ultraviolet-erasable type nonvolatile semiconductor memory device with improved characteristics, which includes a plurality of field oxide films with an asymmetric pattern which are arranged in rows and columns on a semiconductor substrate to define memory cells with a staked gate structure having a floating gate and a control gate. Each of the field oxide films has an extended portion at both sides in a row direction. The floating gate of each memory cell extends to each of the field oxide films so as to provide a substantially increased area, and electrically insulated through a cell slit from adjacent ones in the row direction, while control gates are provided for every rows by a common conductive layer which extends to field oxide films, facing the floating gates in every row directions.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1A is a plan view showing a memory cell structure of an EPROM according to an embodiment of the invention;

DETAILED DESCRIPTION OF THE PREFERRED EMBODIMENT

The ultraviolet-erasable type nonvolatile semiconductor memory device (EPROM) of the invention will now be explained with reference to the drawings.

Figure 1B:
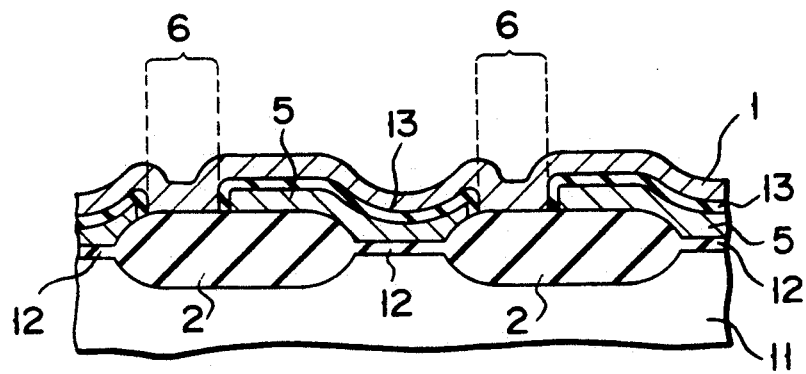
FIG. 1B is a sectional view taken along line A—A' in FIG. 1A.
Figure 1C:
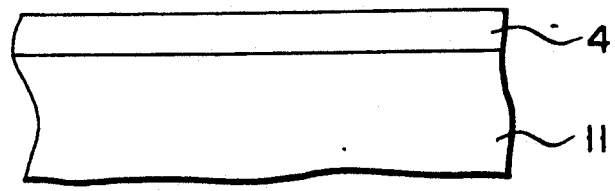
FIG. 1C is a sectional view taken along line B—B' in FIG. 1A.
Figure 2A:
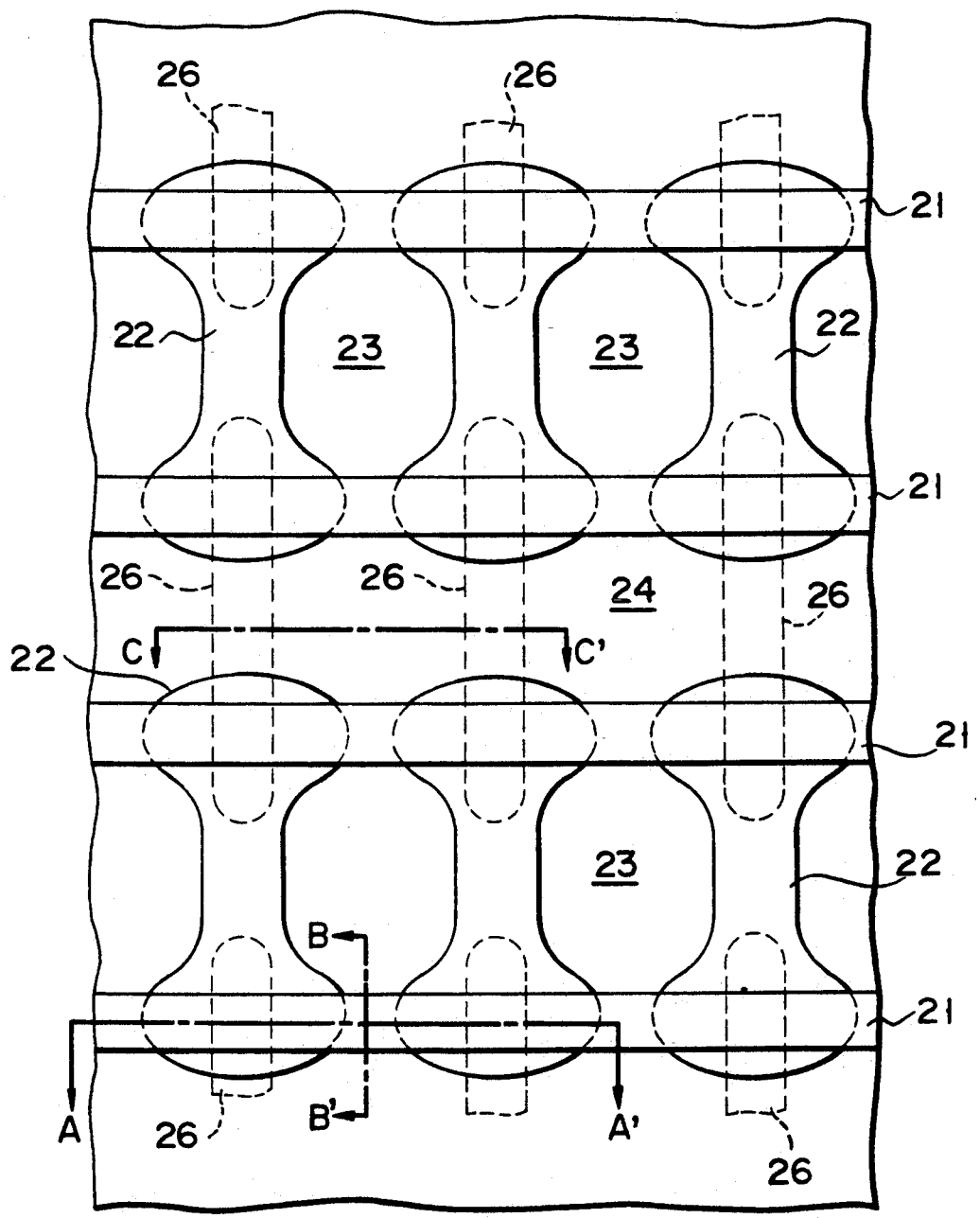
FIG. 2A is a plan view showing a memory cell structure of a conventional EPROM.
Figure 2B:
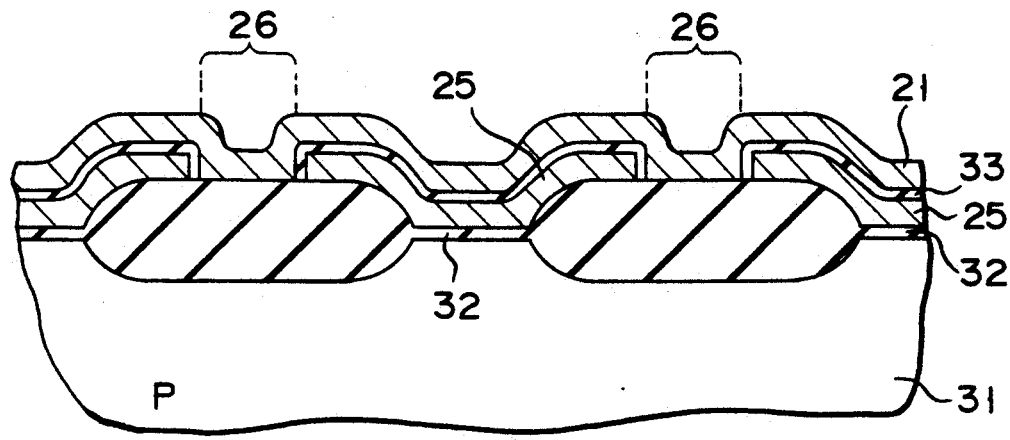
FIG. 2B is a sectional view taken along line A—A' in FIG. 2A.
Figure 2C:
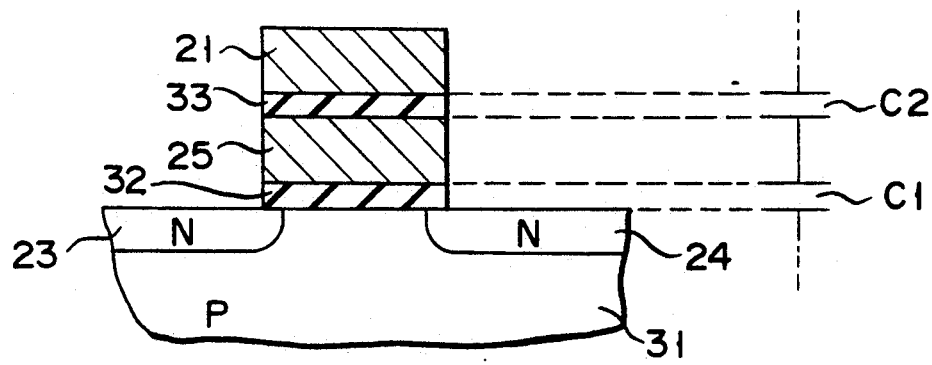
FIG. 2C is a sectional view taken along line B—B' in FIG. 2A.
Figure 2D:
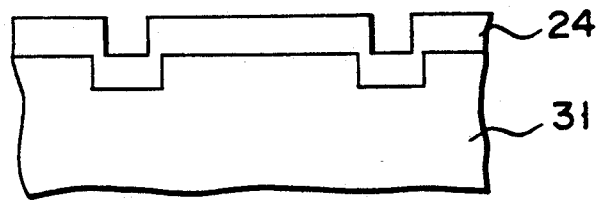
FIG. 2D is a sectional view taken along line C—C' in FIG. 2A.
Figure 3:
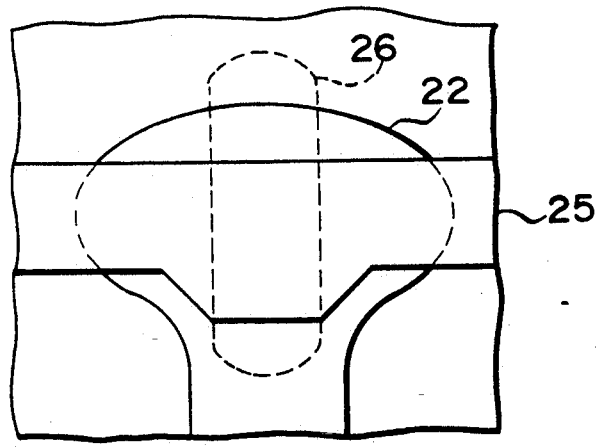
FIG. 3 is a plan view showing a part of the memory cell structure of the conventional EPROM.

In FIGS. 1A through 1C, reference numerals 1 and 1' denote control gates of the stacked gate structure, each of which is provided on the upper portion of the stacked gate structure. The control gates 1 and 1' include extended portion 101 and 102 facing each other in the column direction, and are arranged parallel with one another in the row direction. Reference numeral 2 denotes field oxide films for isolating memory cells, which are arranged in the row and column directions of the substrate surface. Each film has a pattern which includes a base portion 201 extending in the column direction, a first semielliptically extended portion 202 extending to the left, and a second semielliptically extended portion 203 extending to the right. The extended portions 202 and 203 are asymmetrical with respect to a line extending along the base portion 201. The extended portion 202, for example, has a size substantially identical to a portion which is provided by removing the right half portion of one semielliptical portion of the field oxide film 22 (in FIG. 2A), and adding the removed right portion to the left half portion of the same. These field oxide films 2 isolate the memory cells from one another. Reference numeral 3 denotes drain regions 3 each defined by two field oxide films 2 arranged adjacent in the row direction and two control gates 1 and 1' crossing the semielliptically extended portions 202 and 203 of the two films 2 adjacent to each other. A source region 4 is provided by a region facing each drain region 3 through one control gate 1 or 1' in the column direction.

A region enclosed by a dotted line in FIG. 1A is a cell slit 6, which shows a boundary region between the floating gates 5 provided at the lower portion of the stacked gate structure, that is, which includes no floating gate 5 located under the control gate 1 and reaches the source region 4 in the column direction. In order to obtain a high equivalent capacitance, the floating gates 5 are provided with extended portions (not shown) opposed to the extended portions 101 and 102 of the control gates 1 and 1'. In FIG. 1B, reference numeral 11 denotes a P-type silicon substrate, 12 a gate insulating film formed between the substrate 11 and the floating gate 5, and 13 an insulating film formed between the floating gate 5 and control gate 1, respectively.

Further, as shown in FIG. 1A, in each of the field oxide films 2 arranged in the column direction, the cell slits 6 do not overlap the extended portions 101 and 102 of the control gates 1 and 1', and are located above the semielliptically extended portions 202 and 203 in the column direction so as to electrically isolate the floating gates 5. That is, the cell slits 6 are arranged in a staggered fashion in the field oxide films 2 which are adjacent to one another in the column direction. Consequently, the cell slits 6 do not cross the source regions 4. Thus, as shown in FIG. 1C, the unwanted thickness steps are not formed in the substrate 11, thereby reducing each source resistance and increasing the area of each floating gate.

Accordingly, since the stacked gate structure including the control gates 1 and 1' and the floating gates 5 can be made large, the capacitance C2 between the floating gate 5 and control gate 1 will be increased though the capacitance C1 between the semiconductor substrate 11 and floating gate is approximately equal to the capacitance of the conventional structure.

In addition, since each field oxide film 2 has a straight edge at both sides, the size thereof will be also reduced.

Moreover, a variation in the patterns of the field oxide films after making the memory cells may be eliminated as compared to the conventional field oxide films having the semielliptieal portion at both ends.

According to the embodiment described above, even if the area S1 between the semiconductor substrate 11 and floating gate 5, which determines the capacitance C1, is the same as the conventional area, the area S2 between the floating gate 5 and control gate 1, which determines the capacitance C2, is 1.4 times higher than the conventional area. In general, in consideration of dielectric breakdown voltage, the insulating film 13 provided between the floating gate 5 and the control gate 1 is made about 1.5 times thicker than the insulting film 12 provided between the semiconductor substrate 11 and floating gate 5. Thus, if the capacitance C1 is given by 1, the capacitance C2 becomes 2.9 in the embodiment, while it is 2.1 in the conventional structure. Accordingly, the equivalent capacitance C given by $C1 \cdot C2/(C1+C2)$ becomes 0.74 in the embodiment, while it is 0.68 in the conventional structure. Therefore, the cell current can be increased by 10%, as compared to the conventional structure, thereby achieving high speed operation.

Further, a voltage to be applied to the gate insulating film 12, which determines an injection efficiency for injecting electrons into the floating gate 5 by applying a voltage V to the control gate 1, becomes 0.74 V, while it is 0.68 V in the conventional structure. This means that more electrons can be injected into the floating gate in the embodiment than in the conventional case.

As described above, the present invention provides ultraviolet-erasable type nonvolatile semiconductor memory devices which have increased cell current, improved writing characteristics, and reduced source resistance.

It is further understood by those skilled in the art that the foregoing description is a preferred embodiment of the disclosed device and that various changes and modifications may be made in the invention without departing from the spirit and scope thereof.

What is claimed is:

1. A nonvolatile semiconductor memory device comprising:

a semiconductor substrate;

a plurality of isolation films arranged in rows and columns on said semiconductor substrate, said isolation films providing isolation film pairs, said isolation film pairs comprising two of said isolation films adjacent to each other in a row direction;

each of said isolation film pairs including a base portion arranged in a column direction, a first expanded portion extending from one side of said base portion in a first direction parallel with said row direction, and a second expanded portion extending from another side of said base portion in a second direction opposite to said first direction;

an array of memory cells on said semiconductor substrate arranged in memory cell pairs, each memory cell pair including a pair of stacked gate structures having first and second gate insulating films, first and second floating gates and first and second control gates, each of said memory cell pairs being located such that a common drain region is defined by each of said isolation film pairs and that a common source region extending in said row direction is provided between one of said isolation film pairs and another of said isolation film pairs adjacent thereto in said column direction;

a first common conductive layer for providing said first control gate of each of said memory cell pairs, said first common conductive layer extending continuously in said row direction to pass over said first expanded portion of each of said isolation film pairs, said first control gate having a first expanded portion extending on said base portion in said column direction;

a second common conductive layer for providing said second control gate of each of said memory cell pairs, said second common conductive layer extending continuously in said row direction to pass through said second expanded portion of each of said isolation film pairs, said second control gate having a second expanded portion extending on said base portion in said column direction;

said first and second expanded portions of said first and second control gates being opposed to each other;

said first floating gate of each of said memory cell pairs being located beneath said first control gate and having a similar configuration to that of said first control gate, said first floating gate being electrically insulated at said first expanded portion of each of said isolation film pairs by a first cell slit from adjacent floating gates in said row direction; and said second floating gate of each of said memory cell pairs being located beneath said second control gate and having a similar configuration to that of said second control gate, said second floating gate being electrically insulated at said second expanded portion of each of said isolation film pairs by a second cell slit from adjacent floating gates in said row direction.

2. The nonvolatile semiconductor memory device according to claim 1, wherein said first and second expanded portions of each of said isolation film pairs are asymmetric with respect to a central line in the column direction of said base portion.

3. The nonvolatile semiconductor memory device according to claim 1, wherein said first and second expanded portions of each of said isolation film pairs are semi-elliptical in shape.

4. The nonvolatile semiconductor memory device according to claim 1, wherein said first and second cell slits extend to common source regions adjacent to memory cell pairs in said column direction, respectively.

5. The nonvolatile semiconductor memory device according to claim 4, wherein said first and second cell slits are located in a staggered fashion in adjacent rows.

* * * * *